United States Patent
Sobhani et al.

[11] Patent Number: 6,133,616
[45] Date of Patent: Oct. 17, 2000

[54] TEMPSENSE FET WITH IMPLANTED LINE OF DIODES (EPS)

[75] Inventors: Saed Sobhani, Redondo Beach; Daniel M. Kinzer, El Segundo, both of Calif.

[73] Assignee: International Rectifier Corp., El Segundo, Calif.

[21] Appl. No.: 09/165,541

[22] Filed: Oct. 2, 1998

[51] Int. Cl.$^7$ .................................................. H01L 31/058
[52] U.S. Cl. ............................................ 257/470; 257/467
[58] Field of Search ................................. 257/108, 467, 257/469, 470

[56] References Cited

U.S. PATENT DOCUMENTS

| | | | |
|---|---|---|---|
| 5,726,481 | 3/1998 | Moody | 257/467 |
| 5,736,769 | 4/1998 | Nishiura et al. | 257/368 |
| 5,949,121 | 9/1999 | Qualich et al. | 257/467 |

*Primary Examiner*—Jerome Jackson, Jr.
*Assistant Examiner*—Allan R. Wilson
*Attorney, Agent, or Firm*—Ostrolenk, Faber, Gerb & Soffen, LLP

[57] ABSTRACT

A MOSgated device has a plurality of spaced polysilicon diodes on top of a thin insulation layer atop a MOSgated device die. A constant forward current through the diodes produces a voltage drop which is related to the die temperature. The anode and cathode ends of the diode string are connected to the metal pads on the die surface. A first capacitor connects the calkode terminal of the string to the MOSgated device drain electrode and a second capacitor is connected across the anode and cathode ends of the diode string. Both the anode and cathode are unaffected by noise at the drain electrode. The diode string is located within a narrow strip along the die center and is separated from the MOSFET active area by a very narrow termination region which excludes a metal bus.

15 Claims, 6 Drawing Sheets

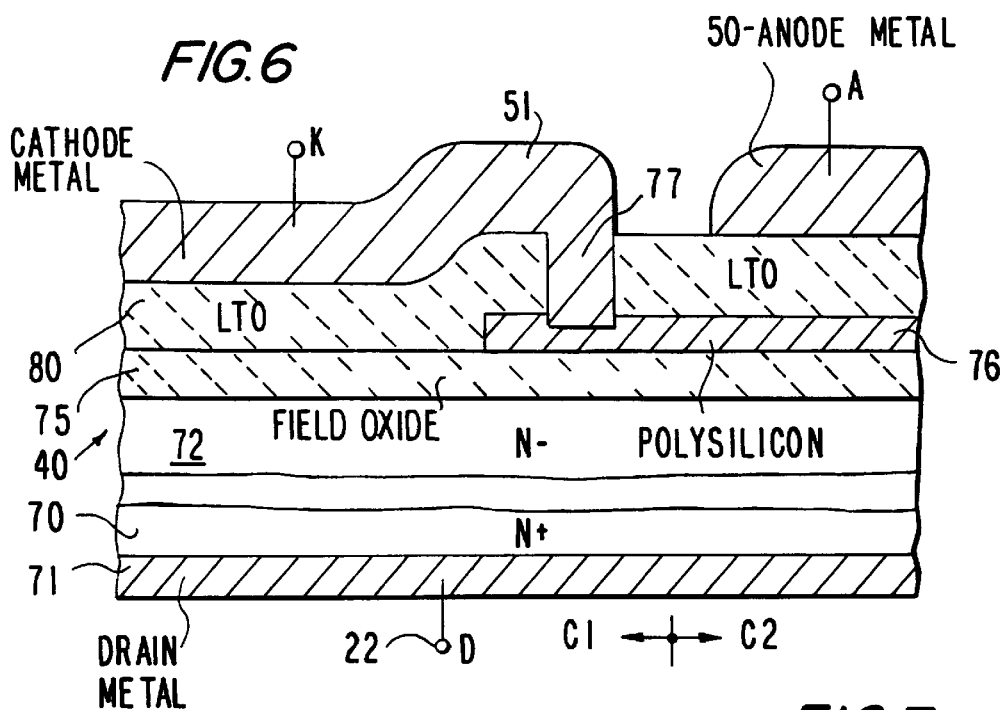
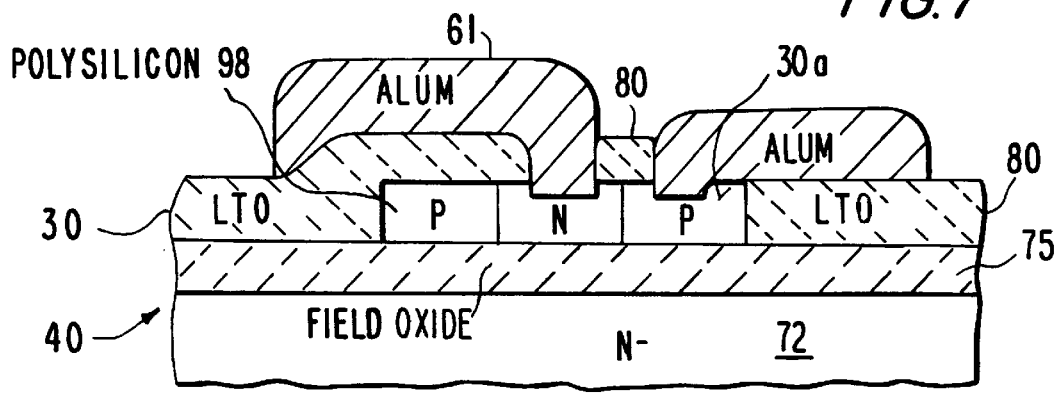
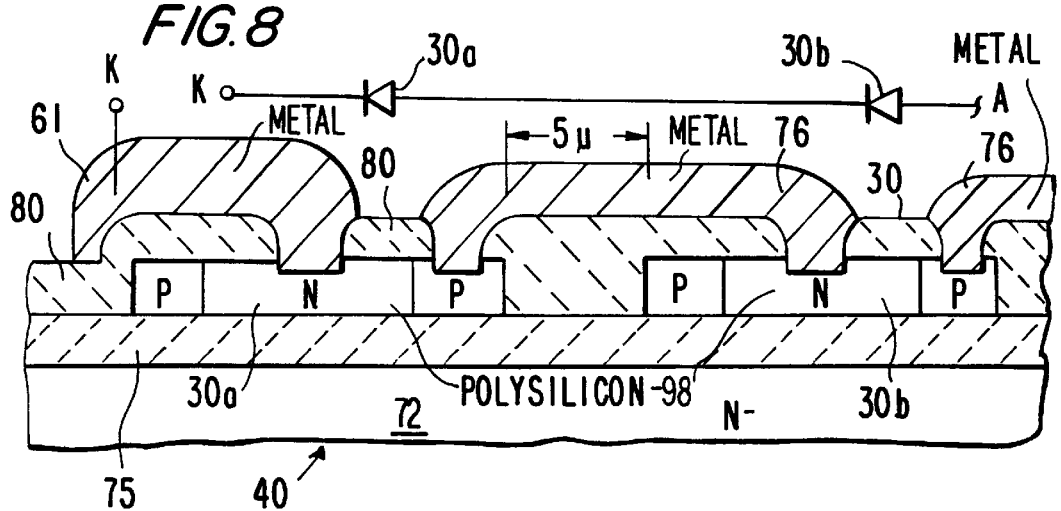

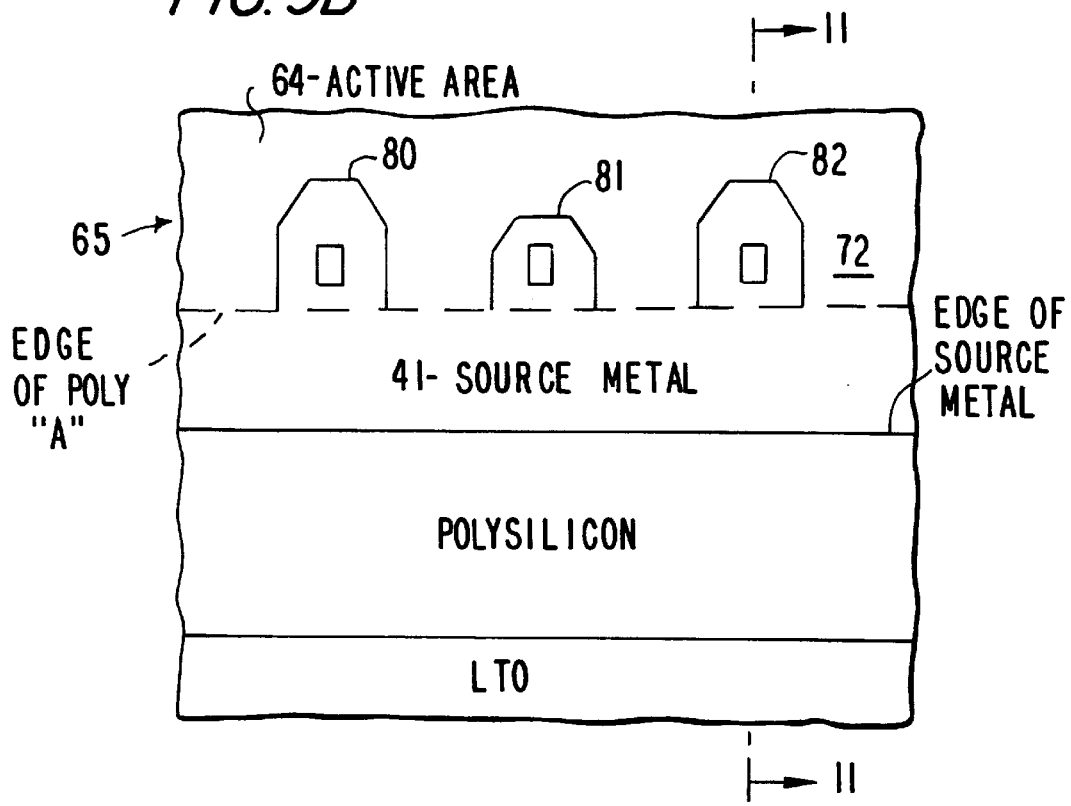
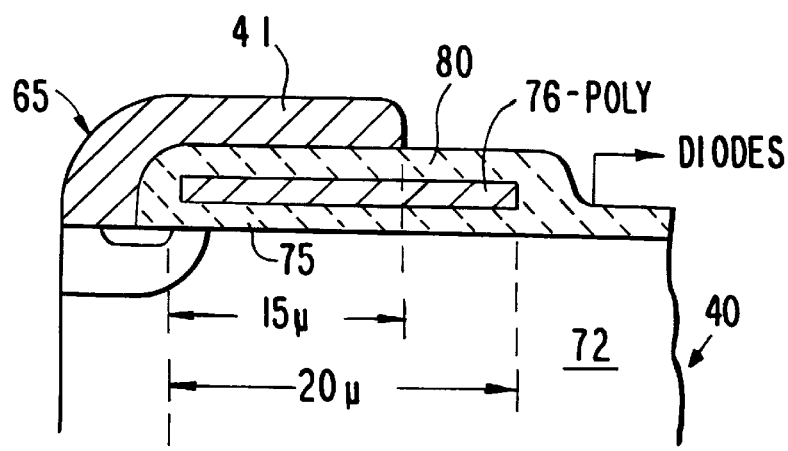

TEMPSENSE FET WITH IMPLANTED LINE OF DIODES (EPS)

BACKGROUND OF THE INVENTION

This invention relates to MOSgated power semiconductor device and more specifically relates to a temperature sensing structure for such devices which occupy a reduced die area, and which are less sensitive to noise due to the power circuit operation.

The use of diodes or bipolar transistors for the temperature sensing of a power MOSFET die is shown for example, in U.S. Pat. Nos. 4,760,434; 4,896,199; 4,903,106; 5,100,829; 5,289,028; 5,389,813; 5,536,958; and 5,545,914.

Such devices are also employed in commercially available devices, such as the WAVEFET™ series of the Motorola Corporation which includes a device type MTC3400.

The prior art devices are arranged in such a way that the temperature sensing diode terminals are inherently capacitively coupled to noisy power terminal, for example, the center terminal of power MOSFETs connected in a "totem-pole" arrangement. Therefore, the temperature sensing device output has noise superimposed thereon to reduce its usefulness and accuracy. Further, the temperature sensing structure has taken a relatively large percentage of the active area of a chip or die.

It would be very desirable to provide a temperature sensing structure which occupies a smaller portion of the available active area of a die of given size, and it would be very desirable to isolate the noise coupled back to the sensor to make its operation more reliable and accurate.

BRIEF DESCRIPTION OF THE INVENTION

In accordance with the present invention, a plurality of series connected diodes are mounted atop the central die area of a MOSgated power semiconductor device, such as a power MOSFET or IGBT or the like and are insulated from the semiconductor die surface by a thin insulation layer. Thus, the diodes are heated to the temperature of the active die area. A forward current is injected into the series diodes and their output voltage drop, which varies inversely with temperature, serves as an output signal to an integrated circuit in the same die or to an external circuit, to initiate corrective or protective action, depending on the measured temperature.

In accordance with a first feature of the invention, the grounded cathode side of the diode circuit is coupled to the drain terminal through a first capacitor $C_1$. Any noise produced at this drain terminal is connected to a low impedance ground and therefore does not affect the forward voltage drop across the diode. The anode side of the diode circuit is coupled through a second capacitor $C_2$ which is connected across the diodes to the calkode side. The anode side of the diode sensor is also isolated from all noise produced at the power drain terminal.

As a further feature of the invention, the diodes are laid out in a line across the center of the die and are isolated from the main source electrode by narrow termination region which reduces the die area needed for the termination. This is accomplished by recognizing that the polysilicon being terminated does not require the usual metal overcoating always used to reduce the lateral polysilicon resistance. The metal line atop the polysilicon in the termination area can increase the width of the termination region by up to about 35 microns to make room for the necessary contact openings. By eliminating this metal in this limited area, but retaining the metal for all other polysilicon gate busses, the area needed for the diode structure termination is substantially reduced.

Further, the diodes of the temperature sensor circuit are rectangles elongated in the direction of the diode strip to reduce the necessary width required for the diodes.

Accordingly, a noise-free diode sensor is provided for temperature monitoring in a MOSgated power device, which occupies a minimized portion of the active area of the die.

BRIEF DESCRIPTION OF THE DRAWINGS

FIG. 6 is a cross-section of FIG. 5 and shows the anode and cathode metal pads for the sensor structure of FIGS. 2 and 5 and shows the structure of capacitors $C_1$ and $C_2$.

FIG. 7 is a cross-section taken across section lines 7—7 in FIG. 6 through one of the polysilicon diodes.

FIG. 8 is a cross-section taken across section lines 8—8 in FIG. 6 and shows two of the diodes in their direction of elongation.

FIGS. 9A and 9B shows a top view of the termination area within circle "A" of FIG. 5, for two different termination cases.

FIG. 11 is a cross-section of the termination area as in FIG. 9B taken across section lines 11—11 in FIG. 9B for a structure in which the metal over the polysilicon is removed to reduce the necessary termination area.

DETAILED DESCRIPTION OF THE DRAWINGS

Figure 1:
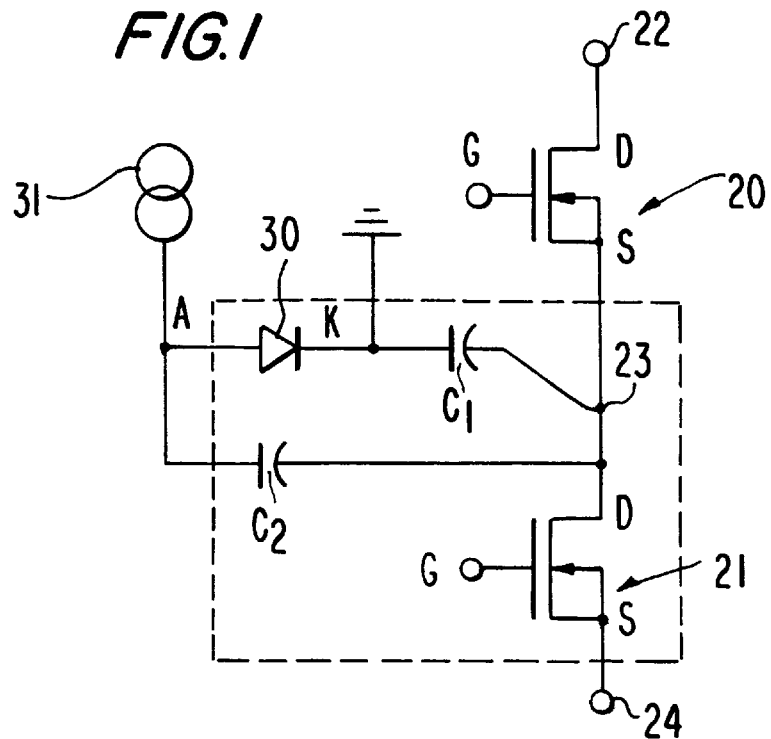
FIG. 1 is a circuit diagram of a temperature sensor connected to MOSgated power semiconductor devices in which the anode of the sensing diode has power circuit noise superimposed on it.

Referring first to FIG. 1, there is shown a typical power MOSFET circuit including two power MOSFETs 20 and 21 connected in a "totem-pole" arrangement in which MOSFET 20 is a high side device and MOSFET 21 is a low side device. Thus, an input voltage is connected to terminal 22, which may be the drain of MOSFET 20 and power to an output circuit is drawn from the node 23 which is the point at which the source of MOSFET 20 is connected to the drain of MOSFET 21. The source of MOSFET 21 may be at ground potential at terminal 24.

In order to monitor the temperature of MOSFET 21, for example, a diode 30, which may be a string of series connected diodes as will be shown, is thermally coupled to the MOSFET 21 die. For example, diode 30 may be fabricated in a polysilicon layer which is disposed atop a thin oxide layer on the silicon die which forms MOSFET 21.

Figure 3:
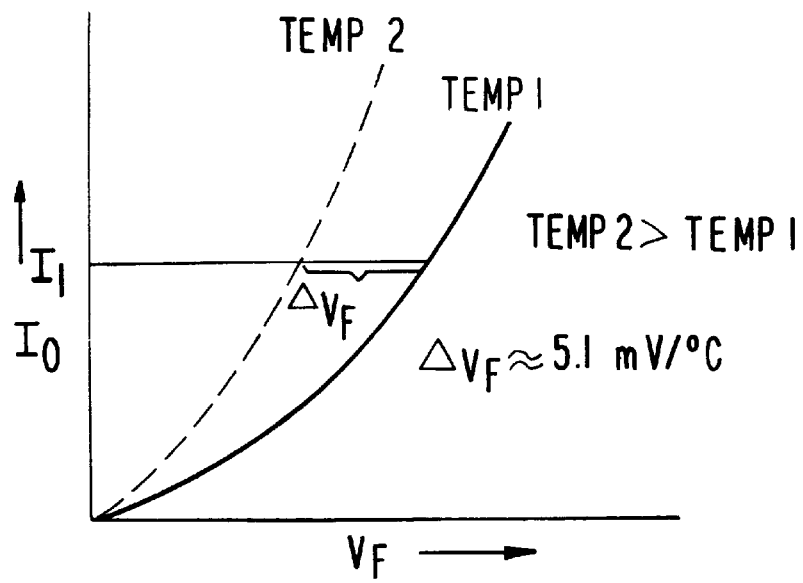
FIG. 3 show the forward voltage characteristic of the diode circuit of FIGS. 1 and 2.

The cathode K of diode 30 is coupled to node 23 by capacitor $C_1$ and its anode A is coupled to node 23 by capacitor $C_2$. A suitable current source 31 then supplies a fixed current $I_1$ (FIG. 3) which flows in the forward conduction direction of diode 30, producing a forward voltage drop $V_F$ across diode 30. This drop is inversely proportional to the diode temperature. Thus, by measuring the change $\Delta V_F$ from the forward voltage drop at room temperature, the die temperature can be measured. The change in forward voltage drop can be about 5.1 mv/° C. as shown in FIG. 3. This measured voltage $V_F$ can be suitably connected to other circuits (not shown) either on the die or external of the die to cause a corrective action, for example, a shut down of the circuit if the die temperature exceeds a given value.

In many circuits, the voltage at node 23 can contain significant noise. The noise will not affect the voltage at cathode K of diode 30 because it is connected through capacitance $C_1$ into a low impedance ground. However, the noise at node 23 (or at the drain of a single MOSFET) is applied to anode A through capacitor $C_2$ and is superimposed on the forward voltage drop of diode 30 to introduce an inaccuracy and noise in the temperature measurement by diode 30.

Figure 2:
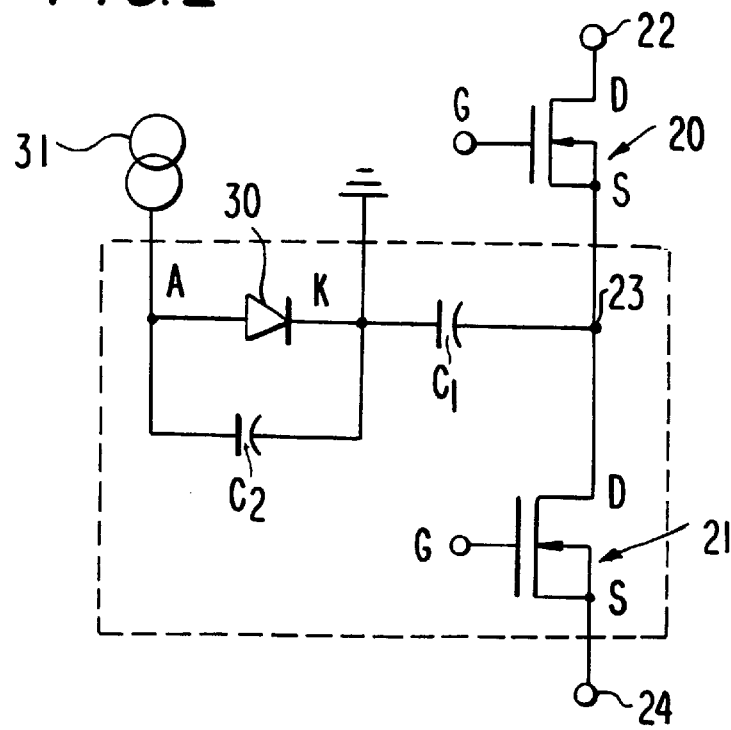
FIG. 2 is a circuit diagram of the temperature sensor of the invention in which both the cathode and anode of the diode sensor is immunized from power circuit noise.

This problem is overcome in the novel circuit of FIG. 2 in which the capacitor $C_2$ is coupled directly across the anode A and cathode K terminals, and therefore isolated from node 23. Thus, neither the anode A nor cathode K will be affected by noise at node 23 and a more accurate and noise-free temperature responsive voltage drop $V_F$ appears across diode 30.

FIGS. 4 to 8 show the novel structure which can be used for the MOSFET 21 to accomplish this novel result.

Figure 4:
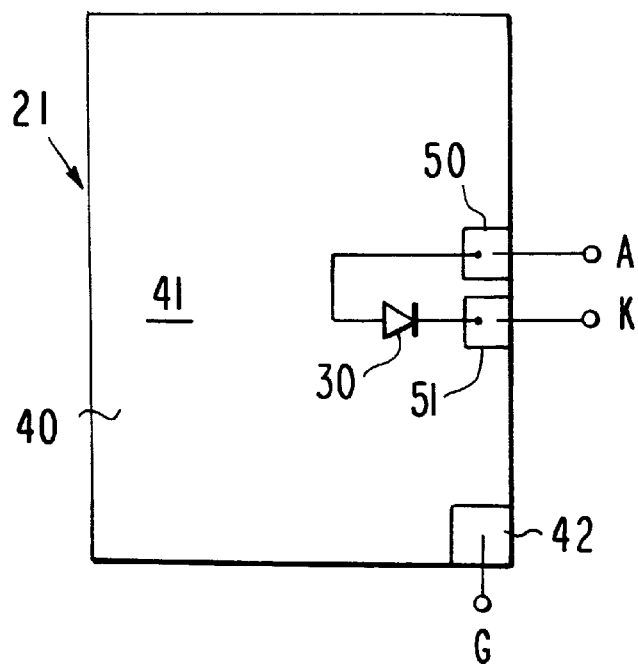
FIG. 4 is a plan view of a power MOSgated die which incorporates the temperature sensor of the invention.

Referring first to FIG. 4 there is shown a die 40 which has a top source electrode 41 and gate pad 42 and which can be made using any desired technology, for example, that shown in U.S. Pat. No. 5,008,725, or in copending application Ser. No. 09/038,453 filed Mar. 11, 1998 or application Ser. No. 09/436,302, filed Nov. 8, 1999, the full disclosures of which are incorporated herein by reference. Die 40 will also have a bottom drain electrode, not shown in FIG. 4. As schematically shown in FIG. 4, the die 40 has a diode sensor 30 thereon which is connected in series with anode contact pad 50 and cathode contact pad 51 which provide connection points for measuring the diode 30 forward voltage drop and for its connection to an external control circuit.

Figure 5:
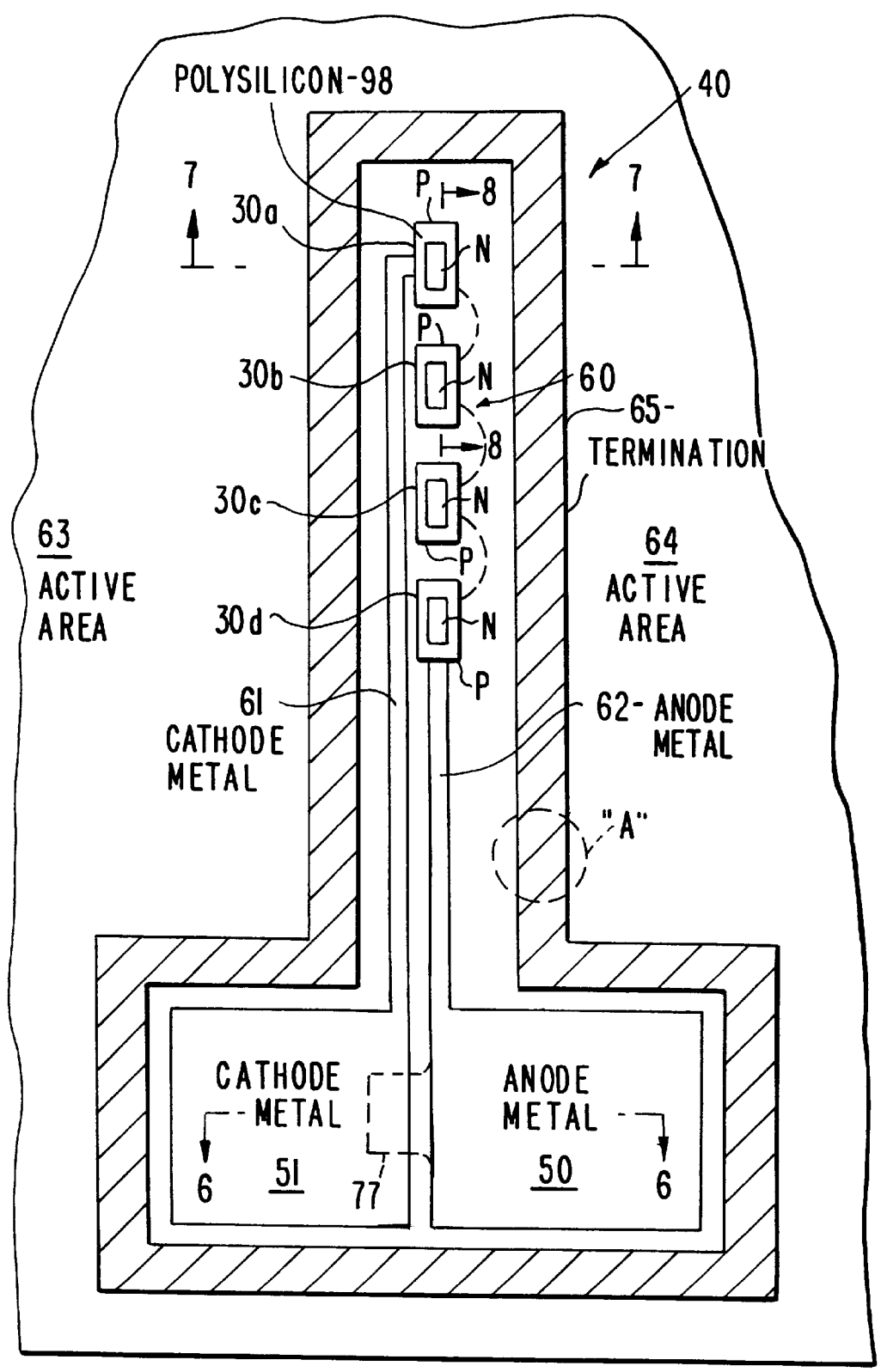
FIG. 5 is an enlarged top view of the temperature sensing structure in the die of FIG. 4.

The topology of a novel diode structure for diode 30 is shown in FIG. 5. Thus, an elongated strip 60 which extends from an edge of the diode 40 to its approximate center, contains four series connected diodes 30a, 30b, 30c and 30d which are positioned over a central portion of die 40. The cathode pad or metal 51 is connected by a conductive trace 61 to the cathode of diode 30a and the diodes are then connected in series by conductive traces to be described. The anode of diode 30d is then connected to anode pad or metal 50 by a conductive metal trace 62. The entire diode system is insulated from the MOSFET active areas 63 and 64 by a termination 65 which will be described later in connection with FIGS. 9A, 9B, 10 and 11.

The capacitors $C_1$ and $C_2$ of FIG. 2 are formed with and beneath the anode pad 50 and cathode pad 51, as best shown in FIGS. 5 and 6. As shown in FIG. 6, die 40 comprises a main N$^+$ support body 70 which may be about 200 microns thick and which receives the drain contact 71. An epitaxially deposited junction receiving layer 72 of N$^-$ material is formed atop body 70. The thickness and concentration of the N$^-$ layer 72 will depend on the reverse breakdown voltage of the MOSFET 21.

An insulation layer 75 which may be a grown layer of silicon dioxide, which is about 7500 Å thick, underlies the diode strip 60 and the termination region 65. A conductive polysilicon layer 76, which may be about 8000 Å thick is grown atop insulation layer 75. Note that polysilicon layer 76 is grown and patterned at the same time as the polysilicon gate layer (99) in the active regions 63 and 64 (not shown) but is isolated from it. The polysilicon 76 is patterned in such a way that it is disposed beneath the anode metal 50 and metal trace 62, but not under the cathode metal 51 (FIG. 6). Furthermore, the polysilicon (98) is patterned to define the diodes 30a, 30b, 30c and 30d, shown in FIG. 5.

Note that the common polysilicon layer 76 is patterned to define 1) the gate poly; 2) the capacitive plate underneath anode pad; and 3) the diodes.

As further shown in FIG. 6, a layer of insulation oxide 80, which is preferably a low temperature oxide (LTO), also deposited during the formation of the active region to insulate the polysilicon gate from the source metal 41, overlies field oxide 75 and the adjacent polysilicon layer 76.

The cathode metal pad 51 and anode metal pad 50 may be isolated segments of the source metal layer 41 and overlie LTO layer 80 and are spaced from one another as shown in FIG. 6. A tab 77, extending from cathode metal 51 is connected to the edge of polysilicon layer 76 (FIGS. 5 and 6).

Thus, the structure of FIG. 6 defines the capacitors $C_1$ and $C_2$ of FIG. 2, with the structure beneath anode metal pad 50 defining capacitor $C_2$ and the structure beneath cathode metal pad 51 defining capacitor $C_1$.

FIGS. 7 and 8 describe the structure of polysilicon diodes 30a, 30b, 30c and 30d of FIG. 5. It will be noted that any desired number of diodes can be used to define the diode 30 of FIG. 2. While the diodes can have any shape, they are preferably made of an elongated rectangular shape (and each has a P-N junction periphery of about 200 microns) to reduce the necessary width of region 60.

The structure rectangular diodes 30a to 30d are shown in FIGS. 7 and 8. Thus, diode 30a, as shown in FIG. 7, has a central N type region surrounded by a P region. The P type frame region has a width of 10 microns and length of 100 microns. The diodes are formed in polysilicon 98 deposited atop field oxide 75. The conductive cathode metal trace 61 is connected to the N region of diode 30a. The diodes 30a and 30b are then connected in series by metal traces (FIG. 8) which connects the P region of a first diode, such as diode 30a to the N region of the next diode 30b. The P region of diode 30b will then connect to the N region of the next diode 30c, and so on, ending with the metal trace 62.

It will be noted that the description to this point connects the capacitor $C_2$ directly across the anode and cathode terminals 50 and 51 as in FIG. 2.

Figure 9A:
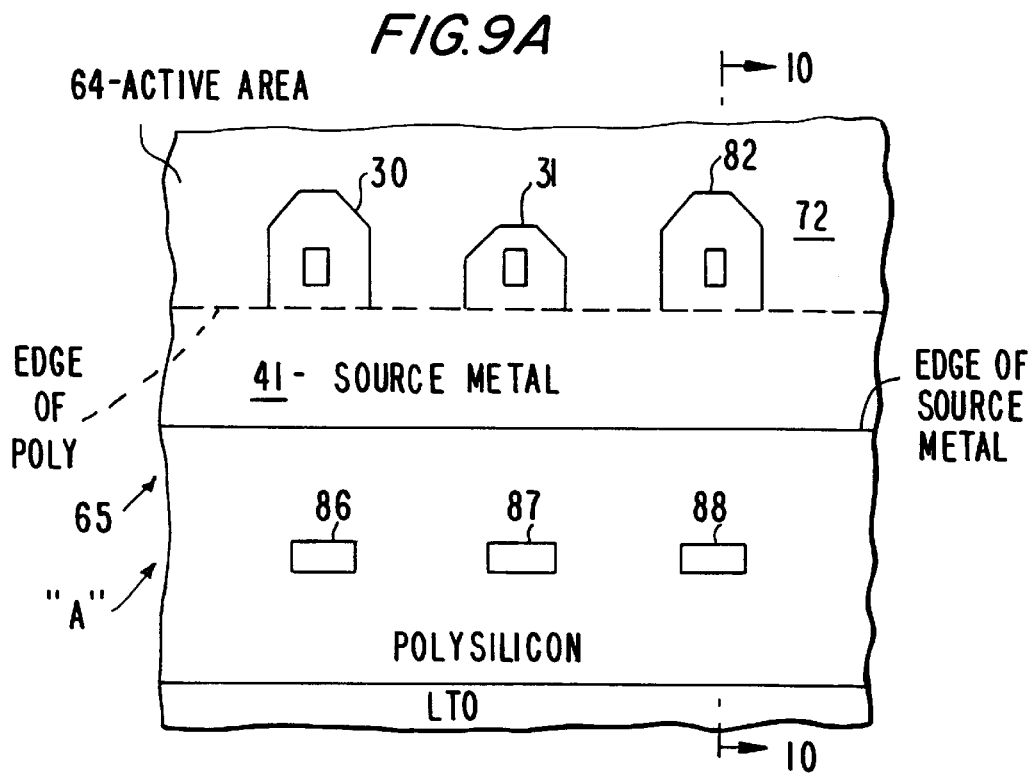
Figure 10:
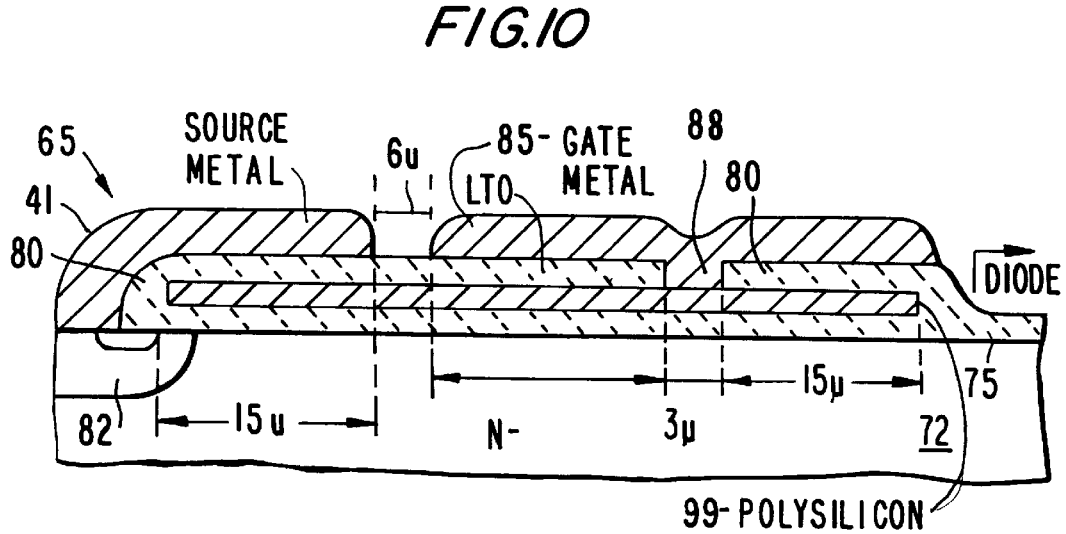
FIG. 10 is a cross-section of the termination area of FIG. 9A taken across section lines 10—10 in FIG. 9A for a structure which includes metal lines overlying the polysilicon at the termination.

FIGS. 9A, 9B, 10 and 11 describe the structure of termination region 65 (at region "A" in FIG. 5). It is desired to make the termination region 65 as narrow as possible to preserve as much active die area as possible. FIG. 9A shows a standard type of termination such as that of copending application Ser. No. 08/946,984 filed Oct. 8, 1997 (IR 1212), the disclosure of which is incorporated herein by reference. Conventionally, the active area is terminated by termination cells such as cells 80, 81 and 82. The source metal 41 overlies and is connected to these cells as shown in FIG. 10 and overlaps the polysilicon layer 99 by about 15 microns. The polysilicon 99 then extends for another approximately 40 microns to the other edge of the termination, at which the diode structure can begin. A metal bus 85 overlies the polysilicon 99 as shown in FIG. 10 and is connected to the polysilicon at spaced contact areas 86, 87 and 88, in order to reduce the lateral resistance of the polysilicon. The metal bus 85 requires a width of about 33 microns to enable the etching of 3 micron wide openings 86, 87 and 88, thus taking up additional area for the termination.

In accordance with another feature of the invention, it has been found that the conductive bias 85 can be eliminated in the sensing diode region termination. Accordingly, as shown in FIGS. 9B and 11, the polysilicon can be shortened to about 20 microns in width, thus saving about 30 microns in width for the termination 65.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A temperature sensor for a MOSgated device; said MOSgated device having a semiconductor die which has first and second power electrodes and a gate electrode for controlling conduction between said first and second power electrodes; said temperature sensor comprising at least one diode junction which said first and second terminals on opposite sides of a P/N junction and which is thermally coupled to said die where by said at least one diode junction is at substantially the same temperature as said die and a current source for causing a fixed current flow in the forward conduction direction of said P/N junction; a first and a second intentional capacitor; said first intentional capacitor coupling said first P/N junction terminal to said first power electrode; said second intentional capacitor being connected across said first and second terminals of said P/N junction; whereby electrical noise at said first power electrode is isolated from the forward voltage drop across said P/N junction which forward drop is caused by forward current through said P/N junction from said current source.

2. The temperature sensor of claim 1 which includes a polysilicon layer atop said die and a thin insulation layer disposed between said polysilicon layer and said die; said diode junction being formed in said polysilicon layer.

3. The temperature sensor of claim 1 wherein said first and second power electrodes are drain and source electrodes respectively, and wherein said first and second terminals of said diode junction are cathode and anode terminals respectively.

4. The temperature sensor of claim 2 wherein said first and second power electrodes are drain and source electrodes respectively, and wherein said first and second terminals of said diode junction are cathode and anode terminals respectively.

5. The temperature sensor of claim 1 wherein said at least one P/N junction consists of a plurality of spaced P/N junctions.

6. The temperature sensor of claim 2 wherein said at least one P/N junction consists of a plurality of spaced P/N junctions.

7. The temperature sensor of claim 6 wherein said first and second power electrodes are drain and source electrodes respectively, and wherein said first and second terminals of said diode junction are cathode and anode terminals respectively.

8. A MOSgated device having a temperature sensor structure integrated therewith; said MOSgated device having a semiconductor die which has a first and second power electrodes and a gate electrode for controlling conduction between said first and second power electrodes; said temperature sensor comprising at least one diode junction which has first and second terminals on opposite sides of a P/N junction and which is thermally coupled to said die whereby said at least one diode junction is at substantially the same temperature as said die; a first and a second intentional capacitor; said first intentional capacitor coupling said first P/N junction terminal to said first power electrode; said second intentional capacitor being connected across said first and second terminals of said P/N junction, whereby noise produced at said first power electrode is isolated from at least said second terminal of said P/N junction.

9. The MOSgated device of claim 1 which includes first and second conductive connection pads atop said die which are connected to said first and second terminals respectively to said at least one P/N junction.

10. The MOSgated device of claim 8 which includes a polysilicon layer atop said die and a thin insulation layer disposed between said polysilicon layer and said die; said diode junction being formed in said polysilicon layer.

11. The MOSgated device of claim 8 wherein said first and second power electrodes are drain and source electrodes respectively, and wherein said first and second terminals of said diode junction are cathode and anode terminals respectively.

12. The MOSgated device of claim 10 wherein said first and second power electrodes are drain and source electrodes respectively, and wherein said first and second terminals of said diode junction are cathode and anode terminals respectively.

13. The MOSgated device of claim 8 wherein said at least one P/N junction consists of a plurality of spaced P/N junctions.

14. The MOSgated device of claim 10 wherein said at least one P/N junction consists of a plurality of spaced P/N junctions.

15. The MOSgated device of claim 14 wherein said first and second power electrodes are drain and source electrodes respectively, and wherein said first and second terminals of said diode junction are cathode and anode terminals respectively.

* * * * *